(12) United States Patent
Grau et al.

(10) Patent No.: US 8,280,543 B2
(45) Date of Patent: Oct. 2, 2012

(54) ARRANGEMENT AND METHOD FOR HANDLING ELECTRONIC COMPONENTS

(75) Inventors: Gérard Grau, Chézard (CH); Raphaël Eigeldinger, Marin (CH)

(73) Assignee: Ismeca Semiconductor Holdings SA, La Chaux-de-Fonds (CH)

( * ) Notice: Subject to any disclaimer, the term of this patent is extended or adjusted under 35 U.S.C. 154(b) by 130 days.

(21) Appl. No.: 12/834,430

(22) Filed: Jul. 12, 2010

(65) Prior Publication Data

US 2010/0280647 A1    Nov. 4, 2010

Related U.S. Application Data

(63) Continuation of application No. PCT/EP2009/050359, filed on Jan. 14, 2009.

(30) Foreign Application Priority Data

Jan. 16, 2008    (EP) ..................................... 08150324

(51) Int. Cl.
*G06F 19/00* (2011.01)
(52) U.S. Cl. .......................... 700/112; 700/228; 702/183
(58) Field of Classification Search .................. 700/228, 700/112; 702/183
See application file for complete search history.

(56) References Cited

U.S. PATENT DOCUMENTS

| | | | |
|---|---|---|---|
| 4,354,268 A | 10/1982 | Michel et al. | |
| 5,949,681 A * | 9/1999 | Asai et al. | 700/113 |
| 6,445,977 B1 * | 9/2002 | Hwang et al. | 700/228 |
| 6,993,456 B2 * | 1/2006 | Brooks et al. | 702/183 |
| 7,035,714 B2 * | 4/2006 | Anderson et al. | 700/228 |
| 7,546,232 B2 * | 6/2009 | Brooks et al. | 702/183 |
| 7,778,727 B2 * | 8/2010 | Kanno et al. | 700/213 |
| 2004/0073404 A1 * | 4/2004 | Brooks et al. | 702/183 |
| 2005/0080508 A1 * | 4/2005 | Kuribara et al. | 700/228 |
| 2005/0278670 A1 * | 12/2005 | Brooks et al. | 716/5 |

FOREIGN PATENT DOCUMENTS

| | | |
|---|---|---|
| CH | 695871 A5 | 9/2006 |
| JP | 06180349 | 6/1994 |
| WO | 2004052069 A1 | 6/2004 |

OTHER PUBLICATIONS

International Search Report for PCT/EP2009/050359 dated Apr. 6, 2009.

* cited by examiner

*Primary Examiner* — Ramesh Patel
*Assistant Examiner* — Anthony Whittington
(74) *Attorney, Agent, or Firm* — Pearne & Gordon LLP

(57) ABSTRACT

Arrangement (1) for processing electronic components, including a plurality of processing stations (3) for processing electronic component, at least some processing stations including an electrical actuator (8); a conveyor (2), such as a turret, for transporting components from one processing station to the next; and a central processing unit (5) for commanding the processing stations. At least some processing stations (3) include a local processing unit (7) for generating command signals (74) for the electric actuators (8). The central processing unit (5) is connected to the local processing units (7) over an electronic bus (6). Digital command instructions (75) are transferred on the electronic bus (6) between the central processing unit (5) and the local processing units (7).

15 Claims, 2 Drawing Sheets

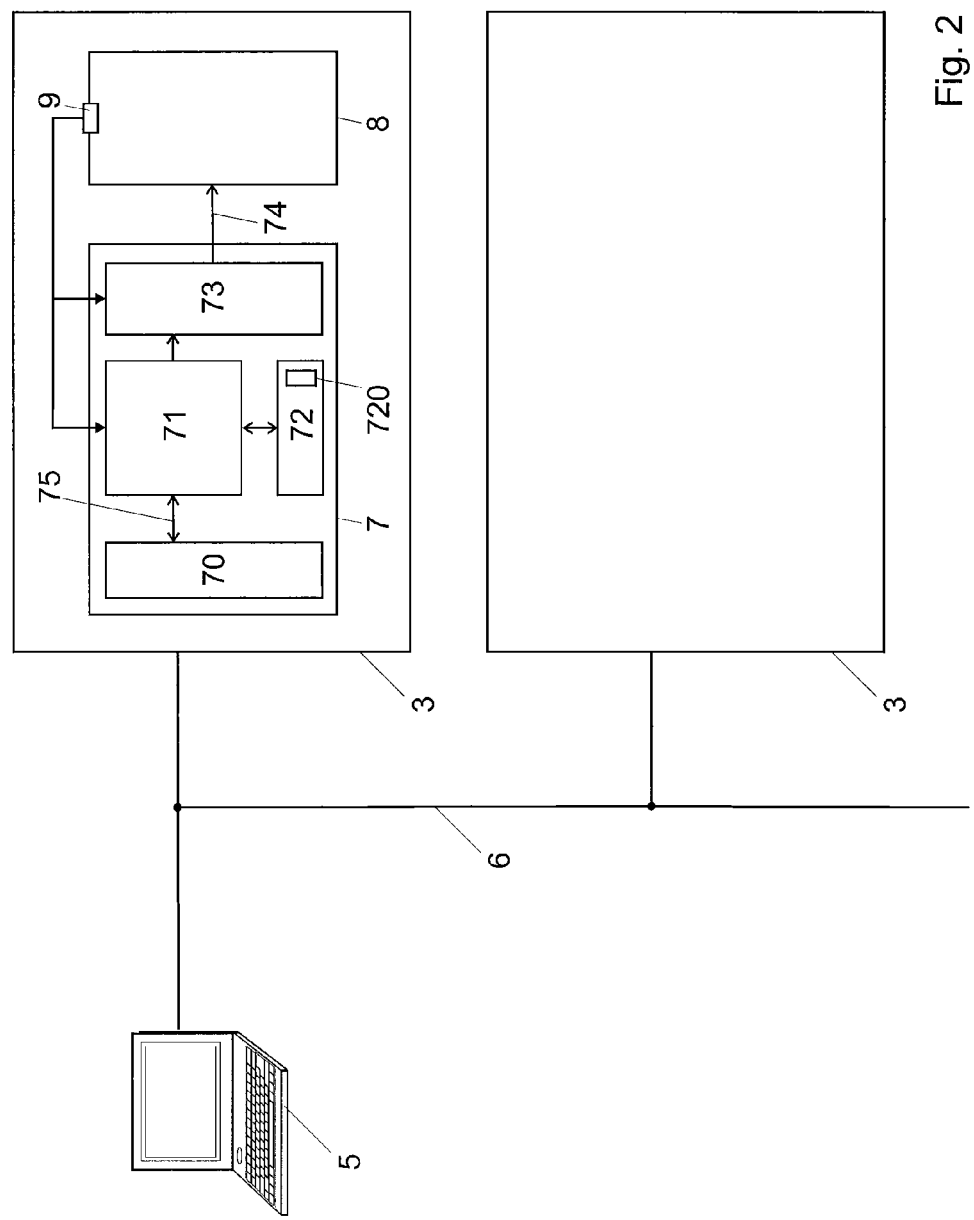

ARRANGEMENT AND METHOD FOR HANDLING ELECTRONIC COMPONENTS

FIELD OF THE INVENTION

The present invention relates to an arrangement and method for handling and/or testing electronic components.

DESCRIPTION OF RELATED ART

During their manufacture, their conditioning or before being integrated into a printed circuit, electronic components generally undergo a series of operations, for example electric tests, along a production line that is often entirely automated. The electronic components are thus transferred from one processing station to another by a conveyor, which can be for example linear or circular.

Circular conveyors are designed for transporting components of small size, and particularly electronic components, between a plurality of processing stations placed at the periphery of a revolving carrousel. These revolving conveyors are often used for manufacturing and conditioning electronic components, as mentioned above.

With reference to FIG. 1, the arrangement 1 comprises a revolving turret 2 that can take a plurality of indexed positions. Several regularly spaced locations of processing stations 3 are defined around the turret, each of which is generally occupied by a processing station performing one or several operations on the electric components presented to it. In certain cases, a processing station can occupy several locations. All the processing stations placed around the turret thus form a cycle of successive operations that the component conveyed on the turret undergo. The turret 2 is equipped with component holders 4 serving to remove or receive the components from the different processing stations, to hold them during the turret's movement and, if necessary, to present them to the following processing station.

The processing stations 3 are usually of different types and perform different functions. While some stations may perform electric or optical tests on the electronic components, other processing stations may for example be required for taking, contacting, centering, flipping, turning or delivering the components. Those and other operations usually require one or several actuators, such as motors, electric and/or or electronic parts at most stations. At least some stations also comprise sensors for sensing parameters of the components and/or actuators.

A fast and reliable processing is only possible if the actions performed by the different actuators at the different stations are perfectly synchronized. The prior art arrangement thus usually comprises a central processing system for controlling and synchronizing the various actuators of the different processing stations. This processing system generates command signals for the different actuators. The central system may for example generate the analog currents delivered to each motor at each station. The local processing stations sometimes comprise amplifiers for amplifying the current signal received from the station. In some arrangements, various digital signals are sent from the central processing system to the local processing stations and processed locally using dedicated digital-to-analog converters. Dedicated connections such as cables are established between the central processing system and the different actuators.

This widespread arrangement suffers from a number of drawbacks. First, the complexity of the central processing system is usually very high as this system must send dedicated signals to a large number of different actuators and parts. This central system must also understand and use the format of command signals required by each actuator. Replacing a station by another station using different actuators thus usually requires an interruption of the whole system for adapting the software executed by the central system, and often installation of new wires between the central system and the updated station. Moreover, using dedicated lines for each actuator is not only costly, but also requires a lot of volume. As low level command signals are transmitted, the bandwidth may be important, requiring even more expensive and large connecting cables.

CH-A1-695871 and WO2004052069 both describe a turret with several stations. The connection to the central station is not described in this document.

U.S. Pat. No. 4,354,268 describes a system comprising a plurality of test heads for testing electronic components. The heads don't comprise any actuators and this document thus does not relate to the driving of actuators.

Another method for testing electronic components with a plurality of local processors, but without any local actuator, is described in JP06180349.

It is therefore an aim of the invention to solve the above mentioned problems.

BRIEF SUMMARY OF THE INVENTION

This application is a continuation of PCT application N° PCT/EP2009/050359 (WO09090187) filed Jan. 14, 2009, the content of which is hereby incorporated.

According to the invention, those problems are solved amongst others with an arrangement for processing electronic components, comprising:

a plurality of processing stations for processing electronic components, at least some processing stations comprising an electrical actuator;

a conveyor, such as a turret, for transporting components from one processing station to the next;

a central processing unit for commanding said processing stations;

at least some processing stations comprise a local processing unit for generating command signals for said electric actuators, said central processing unit is connected to said local processing units over an electronic bus, said central processing unit being arranged for transferring to said local processing units and on said electronic bus high level digital command instructions, said high level digital command instructions indicating: a start time; an end position; a value of displacement along one or several axis; a speed; an acceleration; an indexation; or a trajectory, said local processor unit being arranged for interpreting said high level digital command instructions in order to determine said command signals.

The invention also relates to a method for connecting a central processing unit with a plurality of local processing units using a single type of connecting lines, and preferably a single type of data packets as bearers for the commands. The connecting lines preferably comprise digital connecting lines for IP connections, such as RJ45 cables, and are preferably connected so as to build a network—preferably a ring network or open ring network, but possibly a star-shaped network—around the central processing unit.

The use of an electronic bus between the central processing unit and each processing station is advantageous in that it reduces the amount and the variety of connecting cables in the arrangement. In this context, a bus designates a standard cable or set of cables and connectors for transferring data between computer and electronic components, as opposed to an ad-hoc arrangement and combination of cables of different types dependant on the connected equipment. An essential feature of a bus is its flexibility; replacing or adding components on one side of the bus usually does not need replacement of the bus.

In a typical arrangement, the bus may be a part of a network connection.

The use of local processing units in the processing stations is advantageous because it allows a digital communication between the central unit and each processing station. The digital command instructions to each station are transmitted as multiplexed packets over a single line, and demultiplexed and interpreted locally by a programmable system in the processing stations. Changing the actuators of a processing station thus only requires a new programming of the central unit and of the local processing unit.

Furthermore, the local processing units are able to interpret high level commands sent from the central system, thus making the transmission of low level signals unnecessary.

Low level commands and signals may be executed by the actuators without any interpretation; low level signals may be for example analog and/or digital command signals, such as currents and voltages, directly applied to the actuators for driving them. A low level command signal may be for example a particular voltage or current applied to an input of an actuator for driving this actuator at a particular speed or for imparting a particular acceleration to it.

High level commands are more abstracted, and need interpretation by a microprocessor or another state machine to be executed. High level commands are usually represented by digital commands. Execution or interpretation of a high level command may generate a sequence of low level command signals.

An actuator designates a transducer that converts electric command signals into motion. Examples of actuators include for example electric motors, such as DC motors, stepper motors, voice coils, linear motors, hydraulic and electric cylinders, etc.

BRIEF DESCRIPTION OF THE DRAWINGS

The invention will be better understood with the aid of the description and illustrated by the figures, in which:

FIG. 2 shows a bloc schema of the electronic system for controlling the actuators of the processing stations, wherein only the blocs of one local processing unit are illustrated.

DETAILED DESCRIPTION OF POSSIBLE EMBODIMENTS OF THE INVENTION

Figure 1:
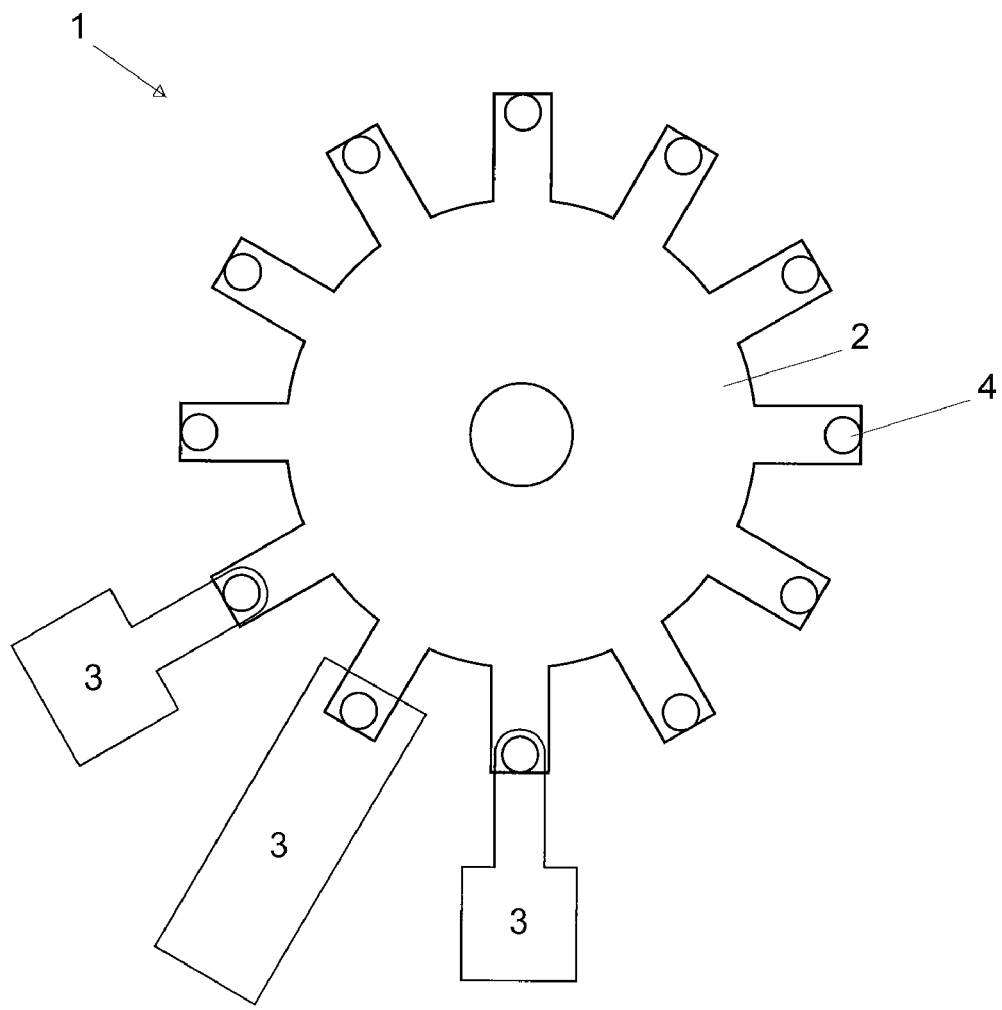
FIG. 1 shows an arrangement comprising a circular turret with several processing stations.

With reference to FIG. 1, an arrangement 1 comprises a conveyor, such as a turret or revolving barrel 2 that can take a plurality of indexed positions. Several regularly spaced locations of processing stations 3 are defined around the turret, each of which is generally occupied by a processing station comprising one or several electric actuators for performing one or several operations on the electric components presented to it. Processing operations performed by the stations 3 may include handling (flipping, aligning, turning, etc), electric testing, optical testing, marking, etc of the electronic components. The result of the processing operations may be used locally in the processing station, sent to a central processing unit, or to another dedicated station.

In certain cases, a processing station can occupy several locations. All the processing stations placed around the turret thus form a cycle of successive operations performed by the convoyed electronic component. The turret 2 is equipped with component holders 4 serving to remove or receive the components from the different processing stations, to hold them during the turrets' movement and, if necessary, to present them to the following processing station. The turret's component-holders 4 may comprise a pick-up nozzle taking and holding the electronic components through air-vacuum.

FIG. 2 shows in diagrammatic form an electronic system for controlling the electric actuators on the various processing stations 3. The system comprises a central processing unit 5, such as an industrial personal computer, a workstation or a digital CNC, comprising preferably input means such as keyboard, mouse, touch screen, tactile display, etc, output means such as a display, permanent and temporary storage means, digital processing means, etc. It is connected over a digital electronic bus 6 to a plurality of local processing units 7 at the various processing stations 3. Each processing station comprises one or several, preferably no more than two, local processing units 7. The electronic bus 6 is preferably a packet-based bus, such as an Ethernet bus. Each local station 3 is preferably connected to the central station 5 over a single type of electronic bus, using for example standard cables for Ethernet such as RJ45 cables. The electronic bus preferably features a ring network layout around the central processing unit 5. The central station 5, the local stations 3 and the bus are thus all parts of a packet network, such as an Ethernet network, comprising a plurality of hot-pluggables nodes. Each local station is connected to the central station 5 and to other nodes of the network through an identical cable, such as an Ethernet cable.

Separate wires may be provided for powering the processing stations or for additional functions, such as video. The wiring between the central processing unit and each processing station is preferably identical for all stations, and is independent of the type of equipment, actuators or processing function performed at each processing station. A processing station can thus be installed, updated or replaced without changing the wiring to the central processing station.

Each local processing unit 7 at the processing station 3 preferably comprises a bus controller 70, a processor 71, a memory 72 and an actuator controller 73 for controlling one or several electric actuators 8. One or several sensors 9, such as linear or angular encoders, optical systems, current control systems etc may be provided. All components of the local processing unit are preferably mounted on a single printed circuit board and/or in a single housing.

The bus controller 70 preferably comprises one Ethernet network interface card or components, as well as connectors mounted on the main printed circuit board or on an additional extension board. It provides physical access to the electronic bus 6 and a low-level addressing system through the use of addresses, which may be defined using switches such as DIP switches. The bus controller 70 comprises input-output digital lines for communicating with the processor 71 and exchanging digital command instructions 75 and other data received over the bus 6.

The processor 71 may be a general purpose microprocessor or microcontroller and executes software stored in permanent, semi-permanent memory 72. The processor 71 controls all other components of the local processing unit 7 and decodes the command instructions 75 received from the bus controller 70 in order to control the actuators 8 accordingly. The software and actuator drivers in memory 72 may depend on the actuators present at the processing station 3, or be generic and independent of actuator type.

The memory 72 may comprise a permanent or semi-permanent memory for storing programs, drivers and permanent settings or parameters, as well as a random access memory (RAM) used during execution of the program. The permanent or semi-permanent memory may comprise electronic memory means, such as ROM, PROM, EPROM, EEPROM, Flash etc memory components, and/or magnetic or optical memory means, such as a hard disk.

The actuator controller 73 preferably builds together with some sensors 9 one or several closed regulation loops, filters and amplifiers for converting digital output signals output by the processor 71 into analog current or voltage signals that actually drive the actuators 8. The current and/or voltages provided may depend on feedback signals provided by sensors 9. Other signals from the sensors 9 may be input to the processor 71 for a digital feedback and/or for forwarding the values to the central processing unit 5. An open-loop driving scheme is also possible at least for some actuators.

The electric actuators 8 may comprise electric motors, such ac DC motors, step motors, voice coils, brushless motors, electro-magnet, vibrators and/or other kind of motors or actuators depending on the processing station.

The digital messages exchanged over the electronic bus 6 are preferably grouped in three channels:

A real time data channel is used for transmitting input/output values and parameters to and from the local processing unit 7. This channel may use a shared memory portion where a Master unit reads the state of inputs and writes the state of outputs, while a Slave unit reads the state of inputs and writes the state of outputs. The Master unit may be a process in the central processing unit 5, while the Slave unit may be a process in the local processing unit 7. It is also possible to change those roles permanently or for a while.

A command channel is used for sending digital command instructions for the actuators 8. The digital command instructions are high level digital instructions for commanding movements or actions from the actuators. The commands may for example indicate a start time, an end position or value of displacement along one or several axis, a speed or acceleration, etc. Other high level commands may specify an indexation, or a trajectory, or a specific move, etc. Those commands are interpreted by a program carried out by the processor 71 in order to determine the drive signals output to the actuators 8 in order to execute the high level order indicated in the command.

A monitoring channel is used by the central processing unit 5 for retrieving parameters of the actuators or of the sensors. The commands exchanged over the monitoring channel indicate the identification of the parameter one wants to retrieve, and the local processing unit sends this value back, or stores it in a shared memory space.

In a preferred embodiment, all messages exchanged over all channels are conveyed using IP packets over an IP port.

The central processing unit preferably also comprises a central clock system that emits a clock signal sent to all the local processing stations for synchronising the steps performed at each station. In addition, the central processing unit 5 may also perform backups of data, log files, programs and drivers at each local processing station 3.

Interpretation of the digital instructions comprises for example one or several of the followings:

Performing plausibility checks, such as for example cyclic redundancy checks, in order to verify if the instruction received is plausible and/or should be performed Computing trajectories of the moving parts, in order to carry out the instructions, such as displacement instructions, received from the central processing unit 5.

Performing collision tests in order to avoid any collision between moving parts

Computing values that should be sent to the actuator controller 73 for driving the actuators 8 in order to carry out the instructions and/or follow the computed trajectories Retrieving data or parameters from memory 72 and/or from sensors 9, and sending or making available those data/parameter to the central processing unit 5.

Reporting the results of the instructions to the central processing unit, when required.

Reporting error or alarm conditions to the central processing unit 5.

Updating program code portions in memory 72

Etc

Each local processing station preferably comprises a memory portion 720 in memory 72, or in another memory, including parameters of the processing station, such as for example a unique ID for each processing station and an identification of the type of processing station, of the available actuators and/or sensors and possibly of the version of the software and drivers installed at each processing station 3. The identification 720 may preferably be retrieved by or transmitted to the central processing unit 5 for it to know which processing station is installed at each indexing position of the turret, and what kind of actuators 8 and sensors 9 are present. This identification may be used by the central processing unit 5 to make sure the commands it sent be understood and executed by the processing station, and possibly for updating the local software and drivers stored in memory 72 of each station. This also allows the central processing unit 5 to automatically detect replacement or updating any of the processing stations 3. A plug and play installation or updating of the processing stations 3 is thus possible, for example if the central processing unit scans the data/parameters of all connected local processing stations and updates its own programs and parameters, as well as the programs of the new processing stations found during the scan. The scan may for example be performed each time the central processing unit is switched on, and/or at regular intervals.

The memory 72, or another part of the processing station 7, may also include authentication means for the central processing unit 5 to make sure the local processing unit 7 is a genuine component from manufacturer. Use of a non authorised processing unit 7, such as counterfeit units, can thus be prevented. The authentication means may include for example cryptographic means, such as challenge-answers mechanisms or secret cryptographic keys or passwords, etc. Furthermore, a cyclic redundancy check or a hash of at least some portions of the memory 72 may be performed and made available to the central processing unit for verifying the integrity and genuineness of the software codes and/or data in the processing station 7.

The invention also relates to a local processing unit 3 as illustrated on FIG. 2 and described in the specification, this local processing unit being independent from other components of the claimed arrangement. The invention further relates to computer medium comprising program data to be executed by the central processing unit and/or by the local processing unit 7 in order to carry out the corresponding parts of the above described and claimed method.

REFERENCES

1 Arrangement
2 Conveyor, such as a turret

3 Various different processing stations
4 Pick-up nozzle
5 Central processing unit
6 Electronic bus
7 Local processing unit
8 Electric actuator
9 Sensor
70 Bus controller
71 Processor
72 Memory (RAM and/or ROM and/or EEPROM and/or Flash and/or hard disk etc)
720 Station Id and/or parameters
73 Actuator controller
74 Command signals
75 Digital command instructions

The invention claimed is:

1. An arrangement (1) for processing electronic components, comprising:—a plurality of processing stations (3) for processing electronic components, at least some processing stations comprising an electrical actuator (8); a conveyor (2) for transporting components from one processing station to the next; and—a central processing unit (5) for commanding said processing stations; wherein, —at least some processing stations (3) comprise a local processing unit (7) for generating command signals (74) for said electric actuators (8), —said central processing unit (5) is connected to said local processing units (7) over an electronic bus (6), —said central processing unit being arranged for transferring to said local processing units and on said electronic bus (6) high level digital command instructions (75), —said high level digital command instructions indicating at least two of: a start time; an end position; a value of displacement along one or several axis; a speed; an acceleration; an indexation; and a trajectory, and—said local processor unit being arranged for interpreting said high level digital command instructions in order to determine said command signals (74).

2. The arrangement of claim 1, wherein:
said command signals (74) generated by said local processing stations (3) comprise analog signals for driving motors.

3. The arrangement of claim 1, wherein said electronic bus (6) is a packet-based bus.

4. The arrangement of claim 1, wherein each said local processing units (7) comprises:
a bus controller (70) for receiving and sending data over said electronic command bus;
a processor (71) for interpreting said digital command instructions (75) received over said bus controller,
at least one actuator controller (73) commanded by said processor (71) and connected to said actuator, for generating said command signals.

5. The arrangement of claim 4, said actuator controller (73) being part of one or several closed regulation loops.

6. The arrangement of claim 1, each local processing unit (7) comprising an electronic identifier (720).

7. The arrangement of claim 1, wherein said central processing unit (5) is a personal computer that synchronizes operations performed by a plurality of processing stations (3).

8. The arrangement of claim 1, said central processing unit (5) comprising a central clock system that emits a clock signal sent to all the local processing stations for synchronising the steps performed at each station 9. A method for processing electronic components, comprising the steps of:—simultaneously processing electronic components at a plurality of processing stations (3); —transporting said electronic components from one processing station (3) to the next using a conveyor; and commanding said processing stations from a central processing unit (5); wherein the method further comprises the steps of:—generation high level digital command instructions (75) in said central processing unit (5), said high level digital command instructions indicating at least two of: a start time; an end position; a value of displacement along one or several axis; a speed; an acceleration; an indexation; and a trajectory, —transferring said high level digital command instructions (75) on an electronic bus (6) between said central processing unit (5) and said processing stations (3), and —interpreting said high level digital command instructions (75) in said local processing station in order to determine command signals (74) for actuators of said local processing station.

10. The method of claim 9, comprising a step of, interpreting said digital command instructions using local processing units in said processing stations (3), and generating analog signals for driving said electric actuators based on the interpretation.

11. The arrangement of claim 3, wherein said electronic bus (6) is an Ethernet-based bus.

12. The arrangement of claim 1, wherein said a conveyor (2) is a turret.

13. An arrangement (1) for processing electronic components, comprising:
a plurality of processing stations (3) for processing electronic components, at least some processing stations comprising an electrical actuator (8) for performing at least one operation on the electronic component;
a turret conveyor (2) for transporting components from one processing station to the next, the processing stations (3) are defined around the turret conveyor; and
a central processing unit (5) for commanding said processing stations;
wherein,
at least some processing stations (3) comprise a local processing unit (7) for generating command signals (74) for said electric actuators (8);
said command signals (74) comprise analog signals for driving motors;
said central processing unit (5) is connected to said local processing units (7) over an electronic bus (6);
said central processing unit being arranged for transferring to said local processing units and on said electronic bus (6) high level digital command instructions (75);
said high level digital command instructions indicating: a start time; an end position; a value of displacement along one or several axis; a speed; an acceleration; an indexation; or a trajectory;
said local processing units (7) comprise
a bus controller (70) for receiving and sending data over said electronic bus (6),
a processor (71) for interpreting said digital command instructions (75) received over said bus controller,
at least one actuator controller (73) commanded by said processor (71) and connected to said electric actuator (8), for generating said command signals, said actuator controller (73) being part of one or several closed regulation loops, and
an electronic identifier (720);
said local processor unit being arranged for interpreting said high level digital command instructions in order to determine said command signals (74);
said electric actuators (8) being arranged to execute low level commands and low level signals without any interpretation; and said command signals (74) generated by said local processing stations (3) comprise analog signals for driving motors.

14. The arrangement of claim 13, wherein the at least one operation performed by the electrical actuator (8) is handling, electric testing, or marking of the electrical component.

15. The arrangement of claim 13, wherein the electric actuators comprise electric motors, step motors, voice coils, brushless motors, electric-magnets, or vibrators.

* * * * *